United States Patent
Wang et al.

(10) Patent No.: US 12,100,787 B2
(45) Date of Patent: Sep. 24, 2024

(54) VERTICAL BLUE LIGHT EMITTING DIODE AND METHOD FOR MANUFACTURING SAME

(71) Applicant: NANJING UNIVERSITY OF POSTS AND TELECOMMUNICATIONS, Nanjing (CN)

(72) Inventors: Yongjin Wang, Nanjing (CN); Shuyu Ni, Nanjing (CN); Jialei Yuan, Nanjing (CN)

(73) Assignee: NANJING UNIVERSITY OF POSTS AND TELECOMMUNICATIONS, Jiangsu (CN)

( * ) Notice: Subject to any disclaimer, the term of this patent is extended or adjusted under 35 U.S.C. 154(b) by 489 days.

(21) Appl. No.: 17/372,316

(22) Filed: Jul. 9, 2021

(65) Prior Publication Data

US 2021/0336097 A1    Oct. 28, 2021

Related U.S. Application Data

(63) Continuation of application No. PCT/CN2019/112933, filed on Oct. 24, 2019.

(30) Foreign Application Priority Data

Jan. 9, 2019   (CN) .......................... 201910018312.8

(51) Int. Cl.
*H01L 21/00* (2006.01)
*H01L 33/00* (2010.01)
(Continued)

(52) U.S. Cl.
CPC ........ *H01L 33/502* (2013.01); *H01L 33/0093* (2020.05); *H01L 33/06* (2013.01); *H01L 33/32* (2013.01); *H01L 33/62* (2013.01)

(58) Field of Classification Search
CPC ... H01L 33/502; H01L 33/0093; H01L 33/06; H01L 33/32; H01L 33/62
See application file for complete search history.

(56) References Cited

U.S. PATENT DOCUMENTS

| 7,697,584 | B2 | 4/2010 | Wierer, Jr. et al. |
| 2007/0126022 | A1 | 6/2007 | Baik et al. |

(Continued)

FOREIGN PATENT DOCUMENTS

| CN | 101523623 A | 9/2009 |
| CN | 108281522 A | 7/2018 |
| CN | 109994578 A | 7/2019 |

OTHER PUBLICATIONS

International Search Report of International Application No. PCT/CN2019/112933 dated Jan. 23, 2020 with English translation, (5p).

*Primary Examiner* — Richard A Booth
(74) *Attorney, Agent, or Firm* — Arch & Lake LLP

(57) ABSTRACT

A vertical blue LED includes: a conductive substrate, the conductive substrate including a first surface and a second surface opposite to the first surface a nitride epitaxial layer; a metal reflective layer, positioned on the first surface; a nitride epitaxial layer, positioned on a surface of the metal reflective layer and including a P-type GaN layer, a quantum well layer, a preparation layer, and an N-type GaN layer that are sequentially stacked along a direction perpendicular to the conductive substrate, wherein a thickness of the nitride epitaxial layer is less than a wavelength of blue light; an N-type electrode, positioned on a surface of the N-type GaN layer; and a P-type electrode, positioned on the second surface.

5 Claims, 5 Drawing Sheets

(51) Int. Cl.
*H01L 33/06* (2010.01)
*H01L 33/32* (2010.01)
*H01L 33/50* (2010.01)
*H01L 33/62* (2010.01)

(56) References Cited

U.S. PATENT DOCUMENTS

| | | | |
|---|---|---|---|
| 2008/0080581 A1* | 4/2008 | Wierer | H01L 33/24 |
| | | | 372/46.01 |
| 2011/0133216 A1* | 6/2011 | Sugawara | H01L 33/0093 |
| | | | 257/E33.001 |
| 2014/0264266 A1* | 9/2014 | Li | H01L 33/56 |
| | | | 438/27 |
| 2015/0028356 A1 | 1/2015 | Lee et al. | |

* cited by examiner

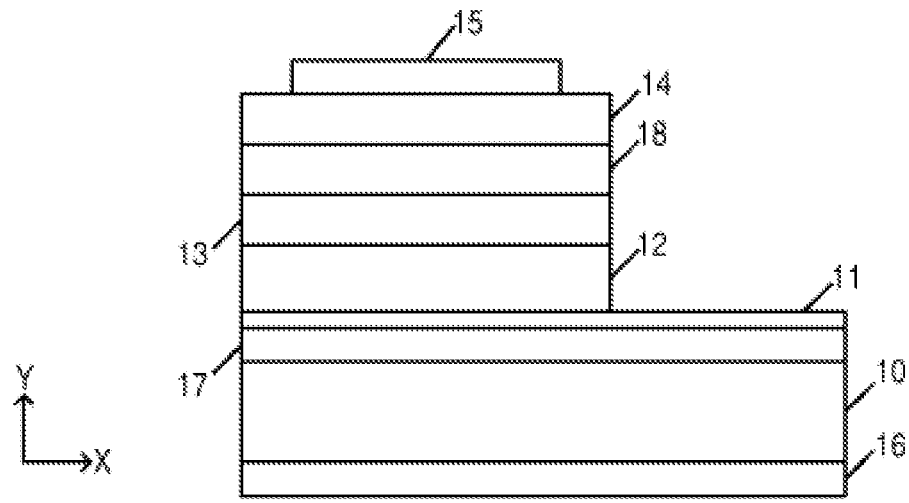

FIG. 1

| Bonding a growth substrate to a conductive substrate; wherein a nitride epitaxial layer and a metal reflective layer are disposed on a surface of the growth substrate, the nitride epitaxial layer comprising a buffer layer, an undoped GaN layer, an N-type GaN layer, a preparation layer, a quantum well layer, a P-type GaN layer that are sequentially stacked along a direction perpendicular to the growth substrate, and the metal reflective layer being disposed on a surface of the P-type GaN layer; and the conductive substrate comprises a first surface and a second surface opposite to the first surface, the second surface comprising a P-type electrode | S21 |

| Peeling off the growth substrate | S22 |

| Etching the nitride epitaxial layer to remove the buffer layer and the undoped GaN layer and to thin the N-type GaN layer, such that a thickness of a residual nitride epitaxial layer is less than a wavelength of blue light | S23 |

| Forming an N-type electrode on a surface of a residual N-type GaN layer | S24 |

FIG. 2

VERTICAL BLUE LIGHT EMITTING DIODE AND METHOD FOR MANUFACTURING SAME

CROSS-REFERENCE TO RELATED APPLICATIONS

This application is a continuation of PCT Patent Application No. PCT/CN2019/112933 filed on Oct. 24, 2019, which claims the priority of Chinese Patent Application No. CN201910018312.8 filed on Jan. 9, 2019, the entire content of both of which is hereby incorporated by reference for all purposes.

TECHNICAL FIELD

The present disclosure relates to the technical fields of illumination, display, and optical communication, and in particular, relates to a vertical blue light emitting diode and a method for manufacturing the same.

BACKGROUND

A light emitting diode (LED) has such advantages as small size, high efficiency, and long life time, and hence has a wide application prospect in the fields of illumination, display, and optical communication. A traditional LED uses a sapphire as a growth substrate. However, since a sapphire substrate is not conductive, the traditional LED generally uses a transverse structure with electrodes on the same side. Such transverse structure at least has two disadvantages: in one aspect, currents transversely flow in an N-type layer and are unequally spaced, and current congestion is present, which results in local heat generation in the LED is severe, and thus affects device performance; in the other aspect, heat conductivity of the sapphire is poor, which limits heat dissipation of the LED device, and affects the life time of the LED device. A vertical LED is present in the related art to overcome the defects of a transverse LED device.

However, in a conventional vertical LED, due to the limitation of a thick film, a plurality of optical confined modes are present. When electrons are implanted, and the vertical LED is luminous, most of emitted light is confined within the thick film of an epitaxial layer of the LED, and in-diaphragm transmission and absorption are caused, such that efficiency of the light emission is significantly reduced.

Therefore, how to prevent confinement caused by the thickness of a LED device to the light emission to improve light emission efficiency of the LED is a problem to be urgently solved.

SUMMARY

The present disclosure provides a vertical blue LED and a method for manufacturing the same.

A vertical blue LED is provided in a first aspect of the present disclosure. The vertical blue LED includes: a conductive substrate, the conductive substrate comprising a first surface and a second surface opposite to the first surface; a metal reflective layer, disposed on the first surface; a nitride epitaxial layer, disposed on a surface of the metal reflective layer and comprising a P-type GaN layer, a quantum well layer, a preparation layer, and an N-type GaN layer, wherein the P-type GaN layer, the quantum well layer, the preparation layer, and the N-type GaN layer are sequentially stacked along a direction perpendicular to the conductive substrate, and a thickness of the nitride epitaxial layer is less than a wavelength of blue light; an N-type electrode, disposed on a surface of the N-type GaN layer; and a P-type electrode, disposed on the second surface.

A method for manufacturing a vertical blue LED is further provided in a second aspect of the present disclosure. The method includes: bonding a growth substrate to a conductive substrate; wherein a nitride epitaxial layer and a metal reflective layer are disposed on a surface of the growth substrate, the nitride epitaxial layer comprising a buffer layer, an undoped GaN layer, an N-type GaN layer, a preparation layer, a quantum well layer, a P-type GaN layer that are sequentially stacked along a direction perpendicular to the growth substrate, and the metal reflective layer being disposed on a surface of the P-type GaN layer; and the conductive substrate comprises a first surface and a second surface opposite to the first surface, the second surface comprising a P-type electrode; peeling off the growth substrate; etching the nitride epitaxial layer to remove the buffer layer and the undoped GaN layer and to thin the N-type GaN layer, such that a thickness of a residual nitride epitaxial layer is less than a wavelength of blue light; and forming an N-type electrode on a surface of a residual N-type GaN layer.

BRIEF DESCRIPTION OF THE DRAWINGS

FIG. 1 is a schematic structural view of a vertical blue LED according to one or more examples of the present disclosure;

FIG. 2 is a flowchart of a method for manufacturing a vertical blue LED according to one or more examples of the present disclosure.

DETAILED DESCRIPTION

Figure 3A:
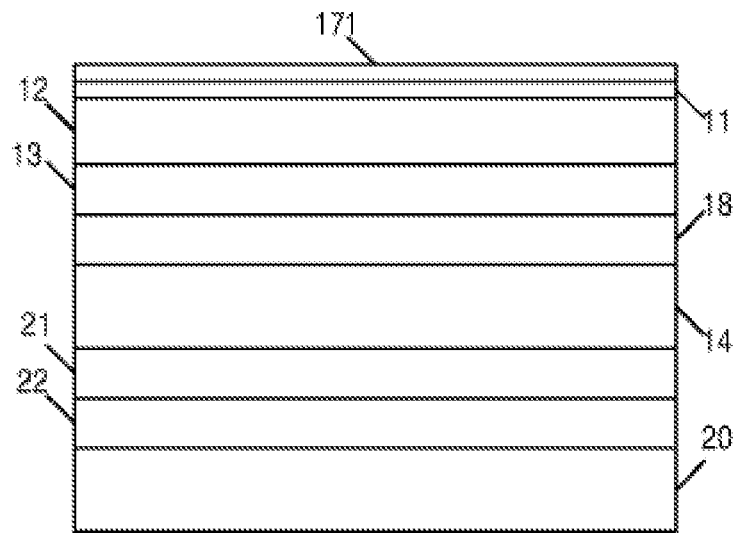
FIG. 3A is a schematic sectional view of processes in the manufacturing of the vertical blue LED according to one or more examples of the present disclosure.

A vertical blue LED and a method for manufacturing the same according to the present disclosure are specifically described hereinafter in combination with the accompanying drawings.

Terms used in the present disclosure are merely for describing specific examples and are not intended to limit the present disclosure. The singular forms "one", "the", and "this" used in the present disclosure and the appended claims are also intended to include a multiple form, unless other meanings are clearly represented in the context. It should also be understood that the term "and/or" used in the present disclosure refers to any or all of possible combinations including one or more associated listed items.

Reference throughout this specification to "one embodiment," "an embodiment," "an example," "some embodiments," "some examples," or similar language means that a particular feature, structure, or characteristic described is included in at least one embodiment or example. Features, structures, elements, or characteristics described in connection with one or some embodiments are also applicable to other embodiments, unless expressly specified otherwise.

It should be understood that although terms "first", "second", "third", and the like are used in the present disclosure to describe various information, the information is not limited to the terms. These terms are merely used to differentiate information of a same type. For example, without departing from the scope of the present disclosure, first information is also referred to as second information, and similarly the second information is also referred to as the first information. Depending on the context, for example, the term "if" used herein may be explained as "when" or "while", or "in response to . . . , it is determined that".

Examples of the present disclosure provide a vertical blue LED. FIG. 1 is a schematic structural view of a vertical blue LED according to an example of the present disclosure. As illustrated in FIG. 1, the vertical blue LED according to some examples may include:

a conductive substrate 10, the conductive substrate 10 including a first surface and a second surface opposite to the first surface;

a metal reflective layer 11, positioned on the first surface;

a nitride epitaxial layer, positioned on a surface of the metal reflective layer 11 and including a P-type GaN layer 12, a quantum well layer 13, a preparation layer 18, and an N-type GaN layer 14 that are sequentially stacked along a direction perpendicular to the conductive substrate 10, wherein a thickness of the nitride epitaxial layer is less than a wavelength of blue light;

an N-type electrode 15, positioned on a surface of the N-type GaN layer 14; and a P-type electrode 16, positioned on the second surface.

Specifically, a wavelength range of the blue light emitted by the vertical blue LED is preferably 450 nm to 470 nm. The quantum well layer 13 according to the specific examples may be an InGaN/GaN quantum well layer. The conductive substrate 10 may be a metal substrate or a silicon substrate. The conductive substrate 10 is preferably a Si (100) substrate. The preparation layer 18 may be made of GaN or InGaN. The N-type electrode 15 and the P-type electrode 16 are made of chrome, platina, or gold. The metal reflective layer 11 may be made of silver, nickel, or an alloy of silver and nickel. The metal reflective layer 11 and the P-type GaN layer 12 form an ohmic contact.

In the specific examples, the N-type electrode 15 and the P-type electrode 16 are positioned on two opposite sides of the conductive substrate 10, a current nearly totally and vertically flows through the nitride epitaxial layer, and nearly no transverse current is present, such that efficiency of electricity implantation is improved. In addition, the thickness of the nitride epitaxial layer is set to be less than the wavelength of blue light, such that the vertical blue LED is not subject to restriction by the confined mode, transmission of light emitted from the LED inside the nitride epitaxial layer is reduced or even eliminated, and loss caused by internal absorption of light is mitigated. In this way, light emission efficiency of the LED is significantly improved. In addition, with the metal reflective layer 11, light loss is reduced, and light emission efficiency of the LED is further improved.

Preferably, the thickness of the nitride epitaxial layer is less than 350 nm to further improve light emission efficiency of the vertical blue LED.

Preferably, the vertical blue LED further includes a NiSn bonding layer 17 positioned between the conductive substrate 10 and the metal reflective layer 11.

The vertical blue LED is obtained by bonding the conductive substrate 10 to a growth substrate, and the bonding layer 17 is formed by bonding a first NiSn bonding layer positioned on the first surface of the conductive substrate 10 to a second NiSn bonding layer positioned on the bonding surface of the growth substrate.

Preferably, the vertical blue LED is in a step-like structure; wherein the step-like structure includes a lower step and an upper step formed of the nitride epitaxial layer. The lower step includes the P-type electrode 16, the conductive substrate 10, and the metal reflective layer 11, and protrudes from the upper step along a direction parallel to the conductive substrate 10.

Specifically, the metal reflecting layer 11 and the nitride epitaxial layer are sequentially stacked on the first surface of the conductive substrate 10 along a Y-axis direction, the upper step is stacked on a surface of the lower step along the Y-axis direction, and the lower step protrudes from the upper step along an X-axis direction. The step-like structure facilitates formation of a passivation layer on the surface of the nitride epitaxial layer subsequently, to protect the nitride epitaxial layer.

Preferably, a thickness of the P-type GaN layer 12 is within a range of 115 nm to 135 nm, a thickness of the quantum well layer 13 is within a range of 40 nm to 60 nm, and a thickness of the preparation layer 18 is within a range of 60 nm to 80 nm.

For example, the thickness of the P-type GaN layer 12 is 125 nm, the thickness of the quantum well layer 13 is 50 nm, and a thickness of the preparation layer 18 is 70 nm.

Figure 3B:
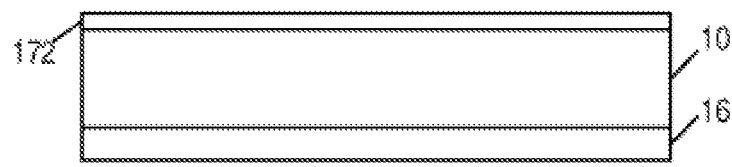
FIG. 3B is a schematic sectional view of processes in the manufacturing of the vertical blue LED according to one or more examples of the present disclosure.
Figure 3C:
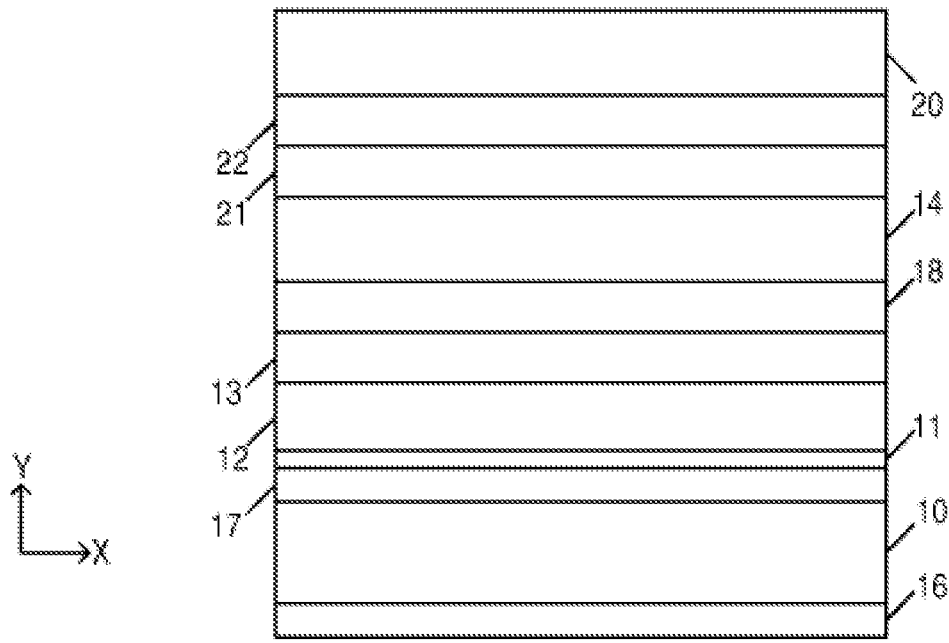
FIG. 3C is a schematic sectional view of processes in the manufacturing of the vertical blue LED according to one or more examples of the present disclosure.

In addition, the specific examples further provide a method for manufacturing a vertical blue LED. FIG. 2 is a schematic flowchart of a method for manufacturing a vertical blue LED according to an example of the present disclosure. FIG. 3A to FIG. 3G are schematic sectional views of processes in the manufacturing of the vertical blue LED according to an example of the present disclosure. A specific structure of the vertical blue LED manufactured according to the example is as illustrated in FIG. 1. As illustrated in FIG. 1 and FIG. 2, and FIG. 3A to FIG. 3G, the method for manufacturing the vertical blue LED according to some examples may include the following steps:

In step S21, a growth substrate 20 is bonded to a conductive substrate 10 to obtain the structure as illustrated in FIG. 3C. A nitride epitaxial layer and a metal reflective layer 11 are arranged on a surface of the growth substrate 20, wherein the nitride epitaxial layer includes a buffer layer 22, an undoped GaN (u-GaN) layer 21, an N-type GaN layer 14, a preparation layer 18, a quantum well layer 13, a P-type GaN layer 12 that are sequentially stacked along a direction perpendicular to the growth substrate 20, and the metal reflective layer 11 is positioned on a surface of the P-type GaN layer 12, as illustrated in FIG. 3A. The conductive substrate 10 includes a first surface and a second surface opposite to the first surface, wherein the second surface includes a P-type electrode 16, as illustrated in FIG. 3B.

The growth substrate 20 may a III-V material substrate, a sapphire substrate, or a silicon substrate. Preferably, the growth substrate 20 is a Si (111) substrate. Specifically, forming the growth substrate 20 includes:

sequentially depositing the buffer layer 22, the undoped GaN (u-GaN) layer 21, the N-type GaN layer 14, the preparation layer 18, the quantum well layer 13, and the P-type GaN layer 12 on the surface of the growth substrate 20;

forming the metal reflective layer 11 on the surface of the P-type GaN layer 12.

A person skilled in the art may select a specific method for forming the metal reflective layer 11 on the surface of the P-type GaN layer 12. For example, an electron beam evaporation process may be used for formation of the metal reflective layer 11.

The quantum well layer 13 according to the specific examples may be an InGaN/GaN quantum well layer. The conductive substrate 10 may be a metal substrate or a silicon substrate. The conductive substrate 10 is preferably a Si (100) substrate. The preparation layer 18 may be made of GaN or InGaN. The metal reflective layer 11 may be made of silver, nickel, or an alloy of silver and nickel. The metal reflective layer 11 and the P-type GaN layer 12 form an ohmic contact. The buffer layer 22 may be made of an AlN/AlGaN, and is intended to reduce stress between the growth substrate 20 and the nitride epitaxial layer.

Thicknesses of layers in the nitride epitaxial layer initially formed on the growth substrate 20 are as follows: the buffer layer 22 has a thickness within a range of 0.6 µm to 0.8 µm, the undoped GaN(u-GaN) layer 21 has a thickness within a range of 0.7 µm to 0.9 µm, the N-type GaN layer 14 has a thickness within a range of 2.7 µm to 2.9 µm, the preparation layer 18 is within a range of 60 nm to 80 nm, the quantum well layer 13 has a thickness within a range of 40 nm to 60 nm, and the P-type GaN layer 12 has a thickness within a range of 115 nm to 135 nm. For example, the thickness of the buffer layer 22 made of the AlN/AlGaN material is 0.7 µm, the thickness of the undoped GaN(u-GaN) layer 21 is 0.8 µm, the thickness of the N-type GaN layer 14 is 2.8 µm, the thickness of the preparation layer 18 made of the GaN material is 70 nm, the thickness of the InGaN/GaN quantum well layer is 50 nm, and the thickness of the P-type GaN layer 12 is 125 nm.

During the bonding process, by causing the metal reflective layer 11 to be orientated towards the first surface of the conductive substrate 10, the growth substrate 20 is bonded to the conductive substrate 10 along a Y-axis direction.

Specifically, bonding the growth substrate 20 to the conductive substrate 10 includes:

forming a first NiSn bonding layer 171 on a surface of the metal reflective layer 11;

forming a second NiSn bonding layer 172 on the first surface of the conductive substrate 20; and bonding the first NiSn bonding layer 171 to the second NiSn bonding layer 172.

Figure 3D:
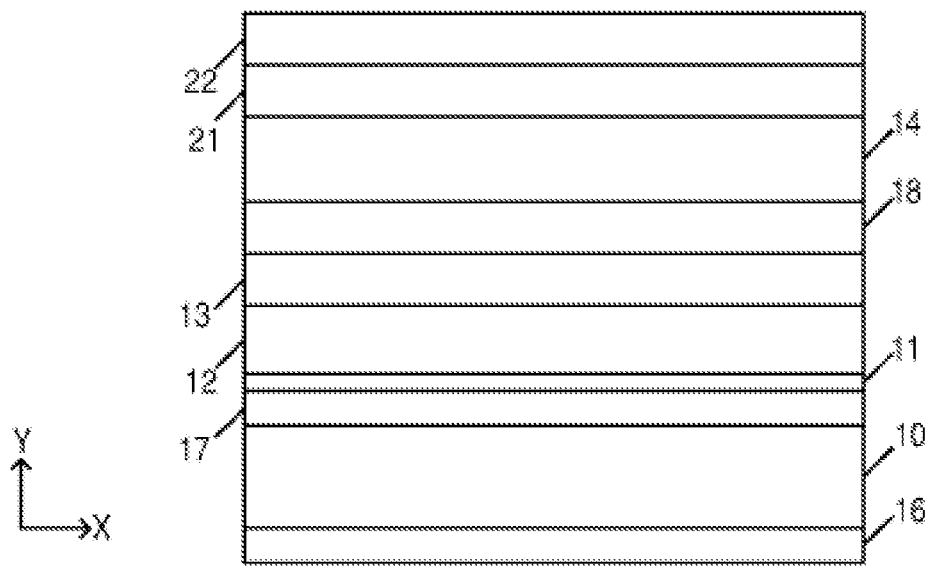
FIG. 3D is a schematic sectional view of processes in the manufacturing of the vertical blue LED according to one or more examples of the present disclosure.

In step S22, the growth substrate is peeled off, as illustrated in FIG. 3D.

Figure 3E:
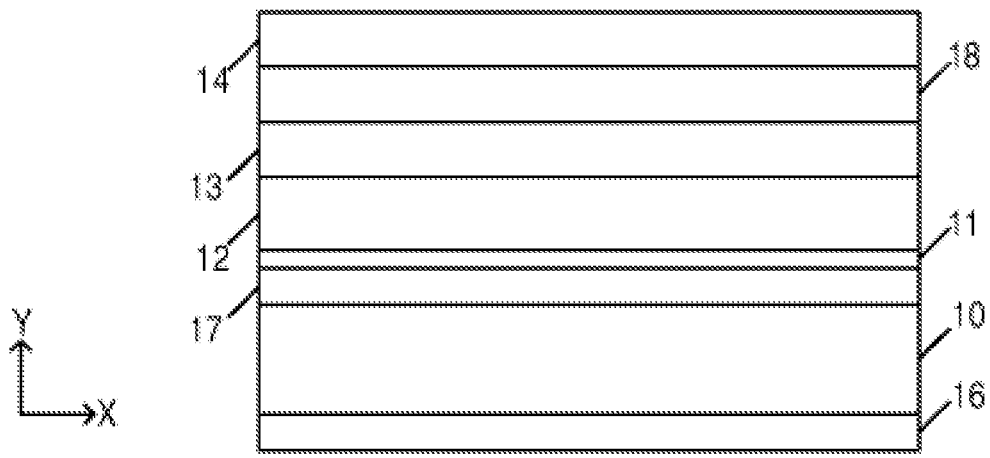
FIG. 3E is a schematic sectional view of processes in the manufacturing of the vertical blue LED according to one or more examples of the present disclosure.
Figure 3F:
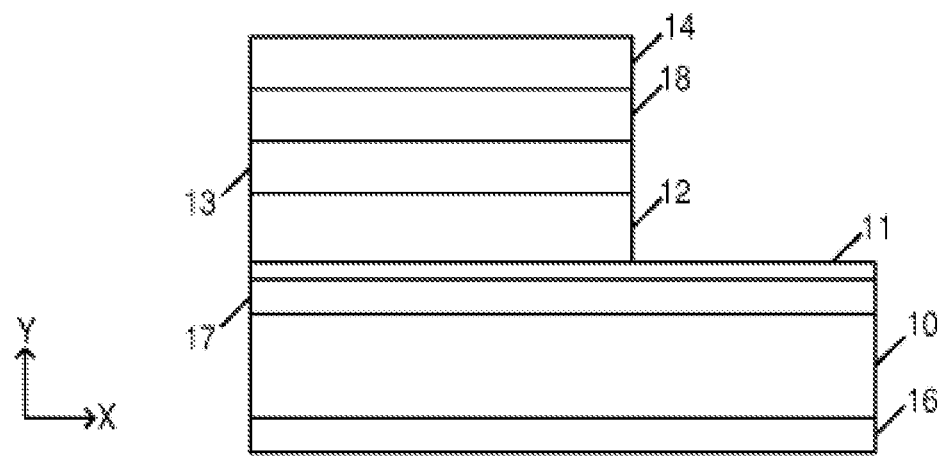
FIG. 3F is a schematic sectional view of processes in the manufacturing of the vertical blue LED according to one or more examples of the present disclosure.

In step S23, the nitride epitaxial layer is etched to remove the buffer layer 22 and the undoped GaN layer 21 and to thin the N-type GaN layer 14, such that a thickness of a residual nitride epitaxial layer is less than a wavelength of blue light, as illustrated in FIG. 3F. In the specific examples, a wavelength range of the blue light emitted by the vertical blue LED is preferably 460 nm to 470 nm.

Preferably, the thickness of the residual nitride epitaxial layer is less than 350 nm to further improve light emission efficiency of the vertical blue LED. In the specific examples, the thickness the residual nitride epitaxial layer refers to a total thickness of the residual N-type GaN layer 14, preparation layer 18, quantum well layer 13, and P-type GaN layer that are subjected to the etching in step S23.

Preferably, etching the nitride epitaxial layer includes:

etching the nitride epitaxial layer to the N-type GaN layer 14 to remove the buffer layer 22 and the undoped GaN layer 21 and to thin the N-type GaN layer 14, such that the thickness of the residual nitride epitaxial layer is less than the wavelength of blue light, as illustrated in FIG. 3E;

defining a device region in the residual nitride epitaxial layer; and forming a step-like structure by etching the residual nitride epitaxial layer in a periphery of the device region to the metal reflective layer 11; wherein the step-like structure includes a lower step and an upper step formed of the residual nitride epitaxial layer in the device region, the lower step including the P-type electrode 16, the conductive substrate 10, and the metal reflective layer 11, and protruding from the upper step along a direction parallel to the conductive substrate 10, as illustrated in FIG. 3F.

Specifically, the nitride epitaxial layer in the periphery of the device region is removed. The metal reflecting layer 11 and the nitride epitaxial layer are sequentially stacked on the first surface of the conductive substrate 10 along a Y-axis direction, the upper step is stacked on a surface of the lower step along the Y-axis direction, and the lower step protrudes from the upper step along an X-axis direction. The step-like structure facilitates formation of a passivation layer on the surface of the nitride epitaxial layer subsequently, to protect the nitride epitaxial layer.

Figure 3G:
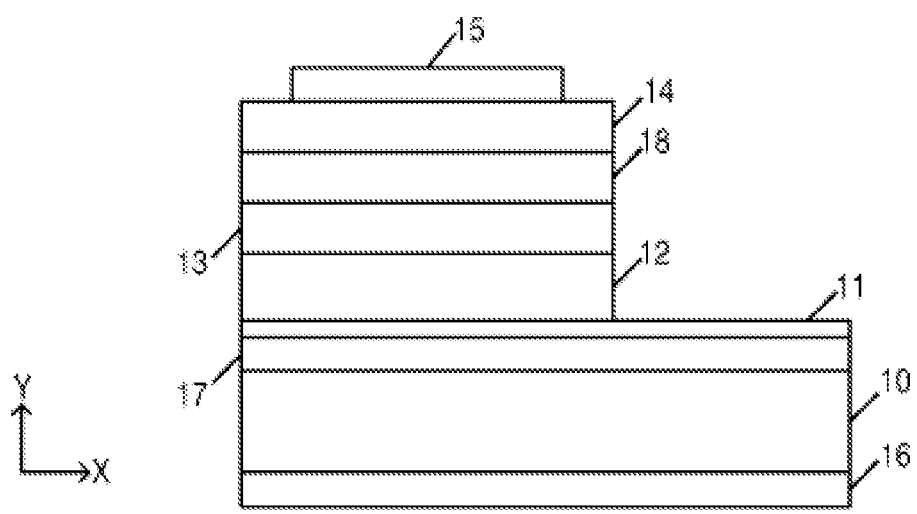
FIG. 3G is a schematic sectional view of processes in the manufacturing of the vertical blue LED according to one or more examples of the present disclosure.

In step S24, an N-type electrode 15 is formed on a surface of a residual N-type GaN layer 14, as illustrated in FIG. 3G.

Specifically, the N-type electrode 15 may be formed by vapor deposition of a metal electrode. The N-type electrode 15 and the P-type electrode 16 are made of chromium, platinum, or gold.

With the vertical blue LED and the method for manufacturing the same according to the specific examples, since the device employs a vertical structure, electricity implantation efficiency is improved. In addition, the thickness of the nitride epitaxial layer is set to be less than the wavelength of blue light, such that the vertical blue LED is not subject to restriction by the confined mode, transmission of light emitted from the LED inside the nitride epitaxial layer is reduced or even eliminated, and loss caused by internal absorption of light is mitigated. In this way, light emission efficiency of the LED is significantly improved. Further, with the metal reflective layer, light emission efficiency of the LED is further improved.

Preferably, the thickness of the nitride epitaxial layer is less than 350 nm.

Preferably, the vertical blue LED further includes a NiSn bonding layer positioned between the conductive substrate and the metal reflective layer.

Preferably, the vertical blue LED is in a step-like structure; wherein the step-like structure includes a lower step and an upper step formed of the nitride epitaxial layer, the lower step including the P-type electrode, the conductive substrate, and the metal reflective layer, and protruding from the upper step along a direction parallel to the conductive substrate.

Preferably, a thickness of the P-type GaN layer is within a range of 115 nm to 135 nm, a thickness of the quantum well layer is within a range of 40 nm to 60 nm, and a thickness of the preparation layer is within a range of 60 nm to 80 nm.

Preferably, the thickness of the residual nitride epitaxial layer is less than 350 nm.

Preferably, bonding the growth substrate to the conductive substrate includes:

forming a first NiSn bonding layer on a surface of the metal reflective layer;

forming a second NiSn bonding layer on the first surface of the conductive substrate; and bonding the first NiSn bonding layer to the second NiSn bonding layer.

Preferably, etching the nitride epitaxial layer includes:

etching the nitride epitaxial layer to the N-type GaN layer to remove the buffer layer and the undoped GaN layer and to thin the N-type GaN layer, such that the thickness of the residual nitride epitaxial layer is less than the wavelength of the blue light; and defining a device region in the residual nitride epitaxial layer; and forming a step-like structure by etching the residual nitride epitaxial layer in a periphery of the device region to the metal reflective layer; wherein the step-like structure includes a lower step and an upper step formed of the residual nitride epitaxial layer in the device region, the lower step including the P-type electrode, the conductive substrate, and the metal reflective layer, and protruding from the upper step along a direction parallel to the conductive substrate.

Preferably, a thickness of the P-type GaN layer is within a range of 115 nm to 135 nm, a thickness of the quantum well layer is within a range of 40 nm to 60 nm, and a thickness of the preparation layer is within a range of 60 nm to 80 nm.

With the vertical blue LED and the method for manufacturing the same according to the present disclosure, since the device employs a vertical structure, electricity implantation efficiency is improved. In addition, the thickness of the nitride epitaxial layer is set to be less than the wavelength of blue light, such that the vertical blue LED is not subject to restriction by the confined mode, transmission of light emitted from the LED inside the nitride epitaxial layer is reduced or even eliminated, and loss caused by internal absorption of light is mitigated. In this way, light emission efficiency of the LED is significantly improved. Further, with the metal reflective layer, light emission efficiency of the LED is further improved.

Described above are examples of the present disclosure. It should be noted that persons of ordinary skill in the art may derive other improvements or polishments without departing from the principles of the present disclosure. Such improvements and polishments shall be deemed as falling within the protection scope of the present disclosure.

What is claimed is:

1. A vertical blue light emitting diode (LED), comprising:
a conductive substrate, the conductive substrate comprising a first surface and a second surface opposite to the first surface;
a metal reflective layer, disposed on the first surface;
a nitride epitaxial layer, disposed on a surface of the metal reflective layer and comprising a P-type GaN layer, a quantum well layer, a preparation layer, and an N-type GaN layer, wherein the P-type GaN layer, the quantum well layer, the preparation layer, and the N-type GaN layer are sequentially stacked along a direction perpendicular to the conductive substrate, and a thickness of the nitride epitaxial layer is less than a wavelength of blue light;
an N-type electrode, disposed on a surface of the N-type GaN layer; and
a P-type electrode, disposed on the second surface;
wherein the N-type electrode and the P-type electrode are positioned on two opposite sides of the conductive substrate to avoid a transverse current, and a current between the N-type electrode and the P-type electrode vertically flows through the nitride epitaxial layer.

2. The vertical blue LED according to claim 1, wherein the thickness of the nitride epitaxial layer is less than 350 nm.

3. The vertical blue LED according to claim 1, further comprising a NiSn bonding layer disposed between the conductive substrate and the metal reflective layer.

4. The vertical blue LED according to claim 1, wherein the vertical blue LED is in a step-like shape; wherein the step-like shape comprises a lower step and an upper step, the upper step comprises the nitride epitaxial layer, and the lower step comprises the P-type electrode, the conductive substrate, and the metal reflective layer, and protruding from the upper step along a direction parallel to the conductive substrate.

5. The vertical blue LED according to claim 1, wherein a thickness of the P-type GaN layer is within a range of 115 nm to 135 nm, a thickness of the quantum well layer is within a range of 40 nm to 60 nm, and a thickness of the preparation layer is within a range of 60 nm to 80 nm.

* * * * *